US010255964B2

(12) United States Patent
Shin et al.

(10) Patent No.: US 10,255,964 B2
(45) Date of Patent: Apr. 9, 2019

(54) SEMICONDUCTOR MEMORY DEVICE HAVING CLOCK GENERATION SCHEME BASED ON COMMAND

(71) Applicant: SAMSUNG ELECTRONICS CO., LTD., Suwon-si, Gyeonggi-Do (KR)

(72) Inventors: Seungjun Shin, Incheon (KR); Su Yeon Doo, Seoul (KR); Taeyoung Oh, Seoul (KR)

(73) Assignee: Samsung Electronics Co., Ltd., Suwon-si,Gyeonggi-do (KR)

( * ) Notice: Subject to any disclaimer, the term of this patent is extended or adjusted under 35 U.S.C. 154(b) by 406 days.

(21) Appl. No.: 15/081,071

(22) Filed: Mar. 25, 2016

(65) Prior Publication Data

US 2017/0004869 A1    Jan. 5, 2017

(30) Foreign Application Priority Data

Jul. 1, 2015    (KR) ........................ 10-2015-0094342

(51) Int. Cl.
| | | |
|---|---|---|
| *G11C 11/00* | (2006.01) | |
| *G11C 8/10* | (2006.01) | |
| *G11C 11/4076* | (2006.01) | |
| *G11C 11/408* | (2006.01) | |
| *G11C 11/4096* | (2006.01) | |
| *G11C 7/10* | (2006.01) | |
| *G11C 8/18* | (2006.01) | |

(52) U.S. Cl.
CPC ........ *G11C 11/4076* (2013.01); *G11C 7/1045* (2013.01); *G11C 8/18* (2013.01); *G11C 11/4087* (2013.01); *G11C 11/4096* (2013.01)

(58) Field of Classification Search
CPC ..... G11C 7/222; G11C 11/406; G11C 7/1066; G11C 8/18; G11C 11/4096; G11C 7/1093; G11C 29/023; G11C 7/1042; G11C 7/1078; G11C 7/1084
See application file for complete search history.

(56) References Cited

U.S. PATENT DOCUMENTS

| | | | |
|---|---|---|---|
| 7,840,830 B2 | 11/2010 | Yoon et al. | |
| 7,864,624 B2 | 1/2011 | Kim et al. | |
| 7,953,998 B2 | 5/2011 | Kang | |
| 7,975,162 B2 | 7/2011 | Kim et al. | |
| 8,055,930 B2 | 11/2011 | Bae et al. | |
| 8,115,524 B2 | 2/2012 | Kim et al. | |
| 8,130,890 B2 * | 3/2012 | Kim ..................... | G11C 7/1066 375/360 |
| 8,254,201 B2 | 8/2012 | Sohn et al. | |
| 8,717,072 B2 | 5/2014 | Park | |
| 8,812,928 B2 | 8/2014 | Ha | |

(Continued)

FOREIGN PATENT DOCUMENTS

KR    10-2011-0078107 A    7/2011

*Primary Examiner* — Hien N Nguyen
(74) *Attorney, Agent, or Firm* — Volentine, Whitt & Francos, PLLC

(57) ABSTRACT

A semiconductor memory device includes a command decoder configured to generate an auto-sync signal in response to a command for writing data at a memory cell or reading data from a memory cell, and an internal data clock generating circuit configured to phase synchronize a second clock, having a clock frequency higher than a clock frequency of a first clock, with the first clock in response to the auto-sync signal.

17 Claims, 18 Drawing Sheets

(56) References Cited

U.S. PATENT DOCUMENTS

| | | | | |
|---|---|---|---|---|
| 2001/0006498 A1* | 7/2001 | Hayashi | ............... | G11B 7/0045 369/47.33 |
| 2007/0061494 A1* | 3/2007 | Wallner | ............... | G11C 7/1006 710/52 |
| 2009/0116598 A1* | 5/2009 | Kim | ..................... | G11C 7/1066 375/360 |
| 2009/0168546 A1* | 7/2009 | Kim | ..................... | G11C 7/1051 365/189.05 |
| 2014/0086002 A1 | 3/2014 | Doo et al. | | |

\* cited by examiner

FIG. 12

|        | CMD CLK Freq. | CLK Buffer Current |
|--------|---------------|--------------------|
| LPDDR3 | 800MHz        | 1mA                |
| LPDDR4 | 1600MHz       | 3mA                |
| LPDDR5 | 3200MHz       | 6mA                |

SEMICONDUCTOR MEMORY DEVICE HAVING CLOCK GENERATION SCHEME BASED ON COMMAND

CROSS-REFERENCE TO RELATED APPLICATION

A claim of priority under 35 U.S.C. § 119 is made to Korean Patent Application No. 10-2015-0094342 filed Jul. 1, 2015, in the Korean Intellectual Property Office, the entire contents of which are incorporated by reference.

BACKGROUND

The present inventive concept herein relates a semiconductor memory device, and more particularly, to a semiconductor memory device for a mobile electronic devices.

Semiconductor memory devices such as a low-power double data rate (LPDDR) synchronous dynamic random access memories (SDRAMs) may be used in mobile electronic devices such as smartphones, tablet PCs, ultra-books, and the like.

As program size of mobile operating systems (OS) becomes greater to support multi-tasking, mobile DRAMs are required to consume less power and to operate at higher speed.

In the case where a mobile electronic device is equipped with an application processor (AP) with multiple cores, a low power semiconductor memory device such as LPDDR SDRAM may be utilized as a working memory of the AP.

Semiconductor memory devices for mobile electronic devices use a DQS clocking method in which a data output strobe signal is received from the AP during a write operation, and an internally generated data output strobe signal is sent to the AP during a read operation. A system clock may be provided from the AP in write and read modes of operation. The DQS clocking method needs a margin tDQSS between data and the data output strobe signal. As operating frequency of semiconductor memory devices becomes higher, the margin tDQSS between data and the data output strobe signal becomes tighter and may cause a failure of write operation.

The clocking method may be changed so that a semiconductor memory device receives a system clock and a data clock from the AP in write and read operations, instead of a data output strobe signal as described above. For clear and concise description, such clocking operating method is referred to as a "WCLK clocking operating method". For the WCLK clocking operating method, the data clock remains at a free running state until the semiconductor memory device transitions to a power-down mode.

SUMMARY

Embodiments of the inventive concept provide a semiconductor memory device capable of reducing power consumption and improving margin between data and a data output strobe signal.

One aspect of embodiments of the inventive concept is directed to provide a semiconductor memory device for high speed write operation. The semiconductor memory device may include a command decoder configured to generate an auto-sync signal in response to a command for writing data to a memory cell or reading data from a memory cell, and an internal data clock generating circuit configured to adjust phase of a second clock to a first clock in response to the auto-sync signal, wherein a frequency of the second clock is higher than a frequency of the first clock.

The first clock may be a system clock associated with a transfer rate of the command or an address and the second clock may be a data clock associated with an input/output rate of the data.

The auto-sync signal may be a pulse signal delayed from input of the command by a predetermined time.

The command may be a column address strobe signal.

An embodiment of the inventive concept is directed to provide a semiconductor memory device for high speed write operation. The semiconductor memory device may include a decoder configured to generate a mode selection signal in response to a command, and a dual clock managing circuit configured to selectively activate one of a first mode clock generator and a second mode clock generator in response to the mode selection signal. The first mode clock generator may use a first system clock having a first clock frequency and a data clock having a clock frequency higher than the first system clock, and the second mode clock generator may use a second system clock having a second clock frequency higher than the first clock frequency and a data output strobe signal of which a frequency is the same as the second clock frequency.

An operating frequency of the first mode clock generator may be higher than an operating frequency of the second mode clock generator.

An embodiment of the inventive concept is directed to provide a semiconductor memory device, wherein the semiconductor memory device may include a command decoder configured to decode a command for writing operation, an internal data clock generating circuit configured to adjust phase to synchronize a data clock with a system clock, having a clock frequency lower than the data clock, in response to the command, and a pattern generator configured to generate an error data code (EDC) hold pattern, used for a clock data recovery operation, in response to the command and to output the EDC hold pattern to an external device through EDC hold pattern pins.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 12 is a diagram illustrating current consumption of a clock buffer according to a frequency of a system clock used in a semiconductor memory device illustrated in FIG. 11;

DETAILED DESCRIPTION

Figure 1:
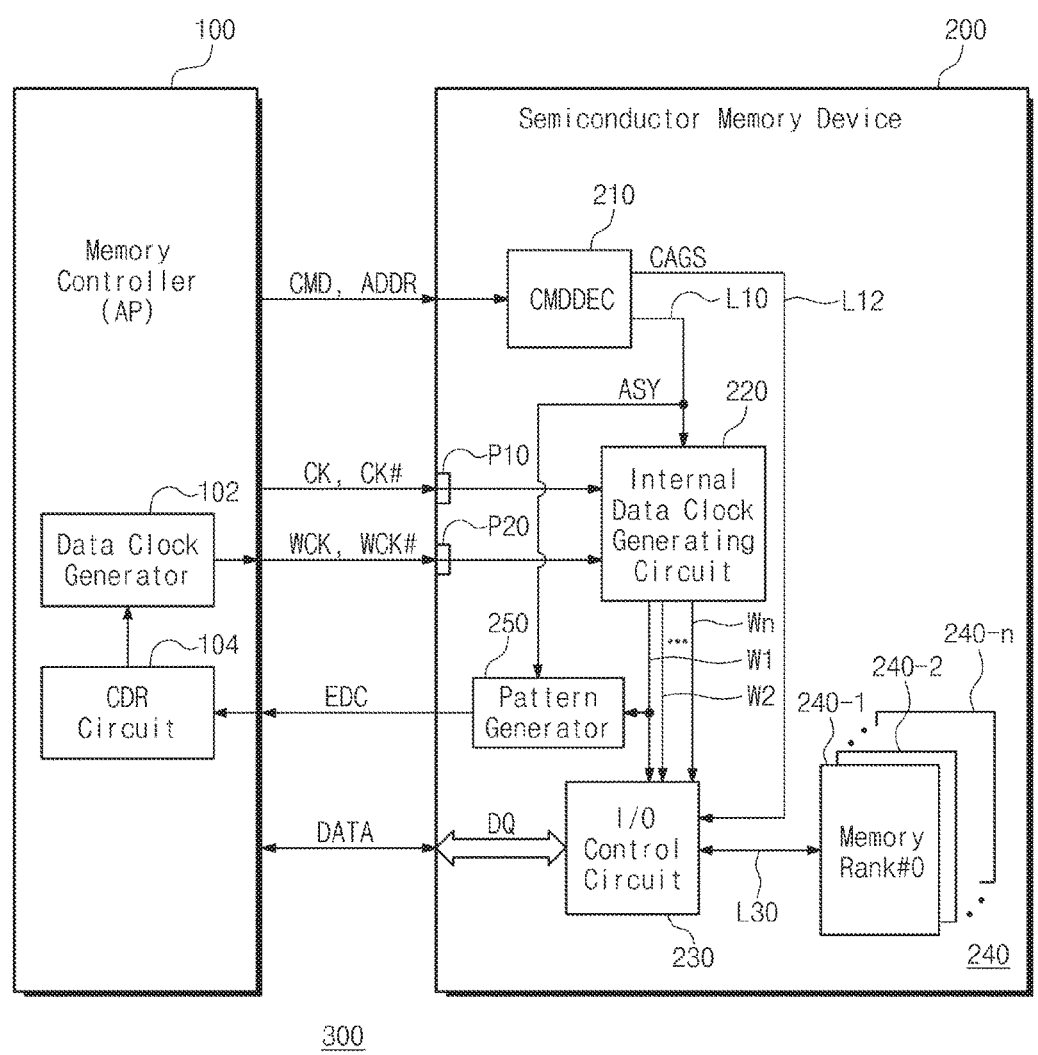
FIG. 1 is a block diagram illustrating a memory system including a semiconductor memory device according to an embodiment of the inventive concept.

Various embodiments of the present disclosure may be described with reference to accompanying drawings. Accordingly, those of ordinary skill in the art will recognize that modifications, equivalents, and/or alternatives of the various embodiments described herein can be variously made without departing from the scope and spirit of the present disclosure.

The term "include," "comprise," "including," or "comprising" used herein indicates disclosed functions, operations, or existence of elements but does not exclude other functions, operations or elements. It should be further understood that the term "include", "comprise", "have", "including", "comprising", or "having" used herein specifies the presence of stated features, integers, operations, elements, components, or combinations thereof but does not preclude the presence or addition of one or more other features, integers, operations, elements, components, or combinations thereof.

With regard to description of drawings, similar components may be marked by similar reference numerals.

Embodiments disclosed herein may include their complementary embodiments. Note that a detailed description associated with a data access operation including write and read operations about a low-power double data rate (LPDDR) synchronous dynamic random access memory (SDRAM) and with an internal function circuit thereof may not be given to prevent the scope and spirit of the inventive concept from becoming ambiguous.

FIG. 1 is a block diagram illustrating a memory system including a semiconductor memory device according to an embodiment of the inventive concept.

Referring to FIG. 1, a memory system 300 includes a memory controller 100 such as an application processor and the like, and a semiconductor memory device for mobile electronic devices 200 having low power consumption and high-speed operation characteristics.

In the case where the memory system 300 is applied to a mobile electronic device, the memory controller 100 may be a mobile application processor (AP) which is driven on an operating system (OS) such as Android™, iOS™, Window phone™, Bada™, Blackberry™, or Symbian. The semiconductor memory device 200 may be, for example, an LPDDR5 SDRAM.

The memory controller 100 includes a data clock generator 102 and a clock data recovery (CDR) circuit 104.

The semiconductor memory device 200 includes a command decoder (CMDDEC) 210, an internal data clock generating circuit 220, an input/output (I/O) control circuit 230, a memory cell array 240, and a pattern generator 250.

The memory controller 100 may issue a command CMD and an address ADDR to the semiconductor memory device 200. Here, the command CMD and the address ADDR may be provided through command/address (CA) pins.

To control data input/output, the memory controller 100 may provide system clocks CK and CK# and data clocks WCK and WCK# to the semiconductor memory device 200. The system clocks CK and CK# may be provided through a port P10 in the form of differential signals with complementary phases. Likewise, the data clocks WCK and WCK# may be provided through a port P20 in the form of differential signals with complementary phases. The system clock may be a clock which is associated with a transfer rate of an address or a command applied to perform a data input/output operation. The data clock may be a clock which is associated with a data input/output rate. For clear and concise description, the system clock is referred to as a first clock while the data clock is referred to as a second clock. According to some embodiments of the inventive concept, a frequency of the second clock may be higher than that of the first clock.

The memory controller 100 may receive an error detect code (EDC) hold pattern EDC from the semiconductor memory device 200 in a CAS command input mode of the semiconductor memory device 200. The EDC hold pattern EDC may be applied to the clock data recovery (CDR) circuit 104 and may be used to perform a clock data recovery function of the memory controller 100. An output of the CDR circuit 104 may be used by the data clock generator 102 to generate the data clock WCK being the second clock. The EDC hold pattern EDC may be generated for a rank, if the memory cell array 240 has a multi-rank structure. To support the multi-rank structure, a non-overlap section may exist between EDC hold patterns generated for a rank.

The CMDDEC 210 of the semiconductor memory device 200 may decode a command and an address to output command/address decoding signals CAGS. The command/address decoding signals CAGS may be transferred to the I/O control circuit 230 through a line L12. The CMDDEC 210 may generate an auto-sync signal ASY in response to a command for writing data at a memory cell or reading data therefrom, and the auto-sync signal ASY may be transferred through a line L10. The auto-sync signal ASY may be a pulse signal which is delayed by a predetermined time from a point when an input of the command is terminated. For example, the command may be a column address strobe (CAS) command In response to the auto-sync signal ASY, the internal data clock generating circuit 220 may adjust phase to synchronize the second clock WCK, having a clock frequency higher than the first clock, with the first clock being the system clock CK. A phase synchronization operation of the internal data clock generating circuit 220 may be performed as a hidden operation of a normal memory operation (a read or write operation) within a column address strobe latency (CL). That is, the phase synchronization operation may not affect a speed of the normal memory operation. The phase synchronization operation about the second clock may be performed by swapping four-phase clock signals which are obtained by dividing a frequency of the second clock by a preset ratio.

According to some embodiments of the inventive concept, the second clock WCK being the data clock may start to toggle just before the command, for example, a column address strobe command is received, without free running in the semiconductor memory device 200. Accordingly, if a scheme for command-based clock generation is applied to the semiconductor memory device 200, the data clock WCK need not continue to toggle in the semiconductor memory device 200. Since the data clock WCK does not work in a standby mode of operation in which a data input/output operation is not performed, current consumption may be reduced.

The I/O control circuit 230 may receive the second clock WCK, phase synchronized with the first clock through the internal data clock generating circuit 220, through at least one of internal data output lines W1 to Wn. The I/O control circuit 230 may be connected to the memory cell array 240 through a line L30 and may control data input/output based on the second clock phase synchronized with the first clock. In a write operation mode, the I/O control circuit 230 may receive write data from the memory controller 100 at an operating speed of the second clock WCK.

During a read operation, the I/O control circuit 230 may output data read from selected memory cells of the memory cell array 240 to the memory controller 100 at the operating speed of the second clock WCK. The read data may be transferred to the memory controller 100 through DQ pins DQ.

The memory cell array 240 may include a plurality of memory ranks 240-1 to 240-n (n being a natural number of 2 or more). The ranks 240-1 to 240-n may share command and control signals so as to reduce the number of signal lines.

The memory cell array 240 may include a main array area where normal memory cells for storing data are arrayed, a dummy array area where dummy memory cells for ensuring a normal operation of the normal memory cells are arrayed, and a redundancy area where spare memory cells for repairing defective normal memory cells are arrayed. The normal memory cells and the spare memory cells may be the same as each other in size and shape. A DRAM memory cell may include an access transistor and a storage capacitor.

Word lines of the memory cell array 240 may be selected by a row decoder, and bit lines thereof may be selected by a column decoder.

Although not shown, the I/O control circuit 230 may include the row decoder, the column decoder, a sense amplifier and I/O gate, and an I/O circuit.

The row decoder may decode a row address to enable a selected word line. The column decoder may decode a column address to enable a selected column line. The sense amplifier and I/O gate may amplify data read out from a memory cell and may output the amplified data to an input/output line. Furthermore, the sense amplifier and I/O gate may write received write data at a selected memory cell. The I/O circuit may output the read data to an external device and may provide the write data to the sense amplifier and I/O gate.

In FIG. 1, an embodiment of the inventive concept exemplifies the memory cell array 240 including DRAM cells. However, the scope and spirit of the inventive concept should not be limited thereto. For example, the memory cell array 240 may include MRAM cells instead of DRAM cells.

A volatile semiconductor memory device such as an SRAM or a DRAM may lose data stored therein at power-off, while a nonvolatile memory device such as a magnetic RAM (MRAM) may retain data stored therein even after power-off. Accordingly, the nonvolatile memory device may be used to store data to prevent data from being lost due to power failure or power interruption. In particular, if implemented with a spin transfer torque magneto resistive random access memory (STT-MRAM), a memory may have advantages of both the DRAM and the MRAM. Command-based clock generation and EDC hold pattern generation will be described with reference to accompanying drawings.

Figure 2:
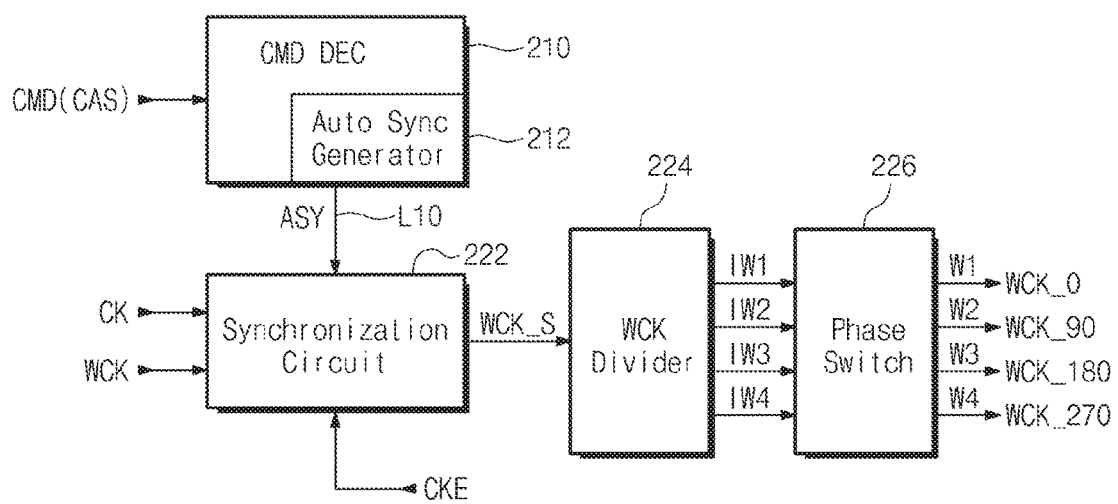
FIG. 2 is a block diagram illustrating a part of a semiconductor memory device illustrated in FIG. 1.

FIG. 2 is a block diagram illustrating a part of the semiconductor memory device illustrated in FIG. 1.

Figure 3:
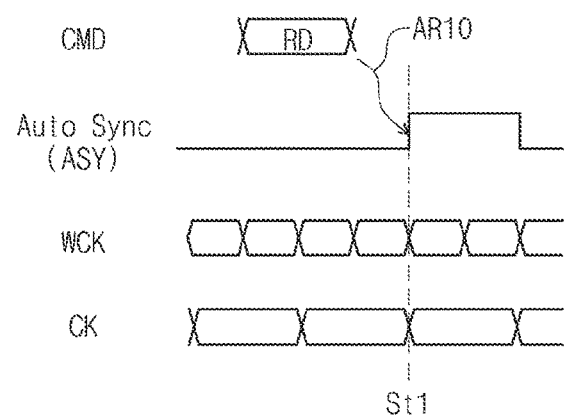
FIG. 3 is a timing diagram illustrating a phase synchronization operation according to an embodiment of the inventive concept.

Referring to FIG. 2, the internal data clock generating circuit 220 includes a synchronization circuit 222, a data clock divider 224, and a phase switch 226. The command decoder 210 illustrated in FIG. 1 includes the auto-sync generator 212. The synchronization circuit 222 may synchronize, as illustrated in FIG. 3, a phase of the first clock being the system clock CK and a phase of the second clock being the data clock WCK in response to the auto-sync signal ASY. The synchronization circuit 222 may be enabled by a clock enable signal CKE.

FIG. 3 is a timing diagram illustrating a phase synchronization operation according to an embodiment of the inventive concept.

Referring to FIG. 3, the auto-sync signal ASY which is delayed by a predetermined time from a point when an input of a command CMD is ended may be generated as a high pulse (refer to an arrow AR10). The data clock WCK and the system clock CK may be synchronized at a point in time St1 when the auto-sync signal ASY is generated as a high pulse. In FIG. 3, an embodiment of the inventive concept exemplifies a frequency of the data clock WCLK which is two times higher than that of the system clock CK.

According to a command-based clock generation scheme, phase synchronization may be performed if the data clock WCK toggles just before a column address strobe signal CAS of a read command RD or a write command is received, without continuing to toggle. Accordingly, the data clock WCK may not work in a standby mode of operation where a data input/output operation is not performed, and thus, current consumption may be reduced at a standby operation.

Figure 4:
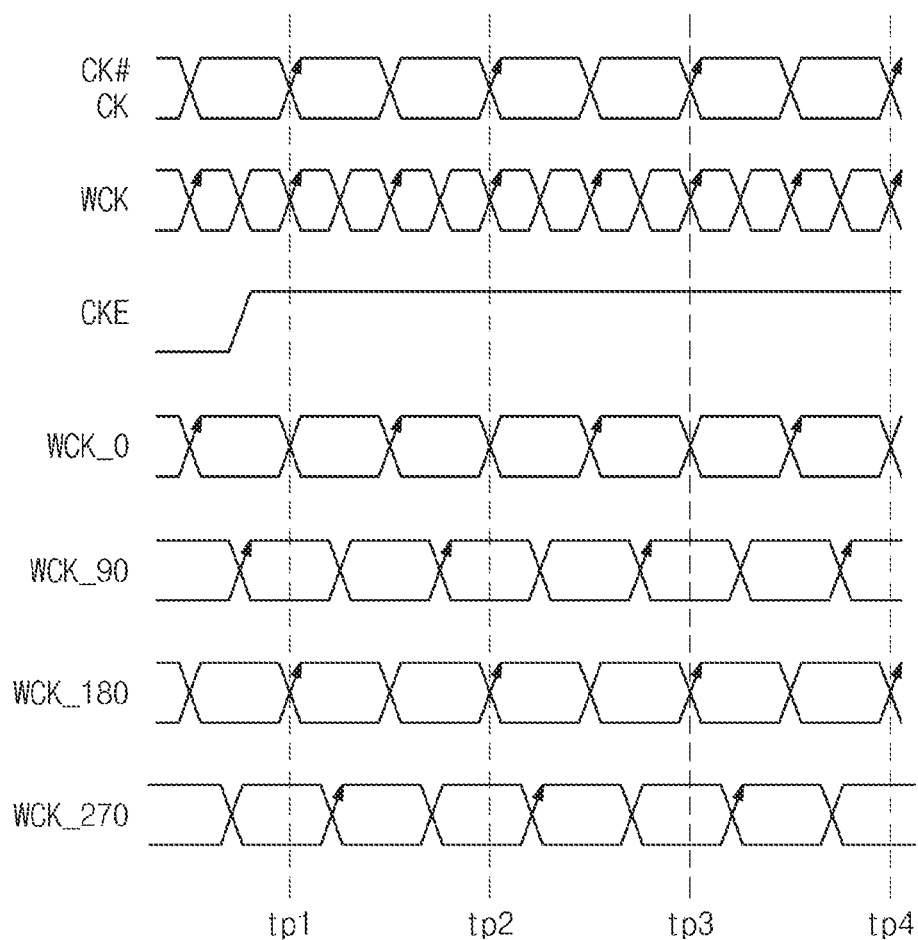
FIG. 4 is a timing diagram illustrating generation of four-phase clock signals according to an embodiment of the inventive concept.

FIG. 4 is a timing diagram illustrating generation of four-phase clock signals according to an embodiment of the inventive concept.

Referring to FIG. 4, when the system clock CK, the data clock WCK, and the clock enable signal CKE are applied to FIG. 2, four-phase clock signals WCK_0, WCK_90, WCK_180, and WCK_270 generated by the WCK divider 224 may appear. The WCK divider 224 may divide a frequency of a data clock WCK_S by a preset ratio (divideby-2 in FIG. 4) to output four-phase clock signals WCK_0, WCK_90, WCK_180, and WCK_270 with a 90-degree phase difference from each other through dividing output terminals IW1, IW2, IW3, and IW4.

It should be understood from FIG. 4 that phases of the system clock CK and the phase clock signal WCK_0 may not be the same at tp1, tp2, tp3, and tp4. In this case, clock swapping may be made by the phase switch 226 illustrated in FIG. 2. This will be described with reference to FIG. 5 in more detail.

Figure 5:
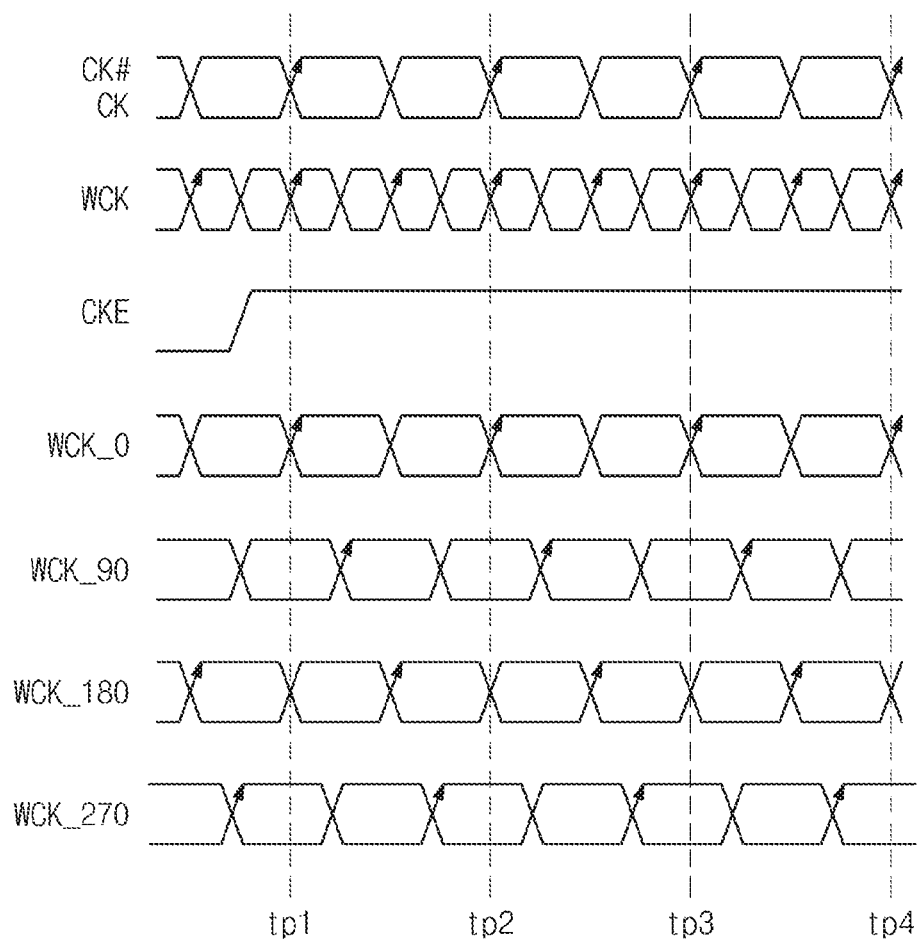
FIG. 5 is a timing diagram illustrating swapping between four-phase clock signals illustrated in FIG. 4.

FIG. 5 is a timing diagram illustrating swapping between four-phase clock signals illustrated in FIG. 4.

Referring to FIG. 5, the phase switch 226 which receives four-phase clock signals WCK_0, WCK_90, WCK_180, and WCK_270 may swap the phase clock signals WCK_0 and WCK_180 with each other and may swap the phase clock signals WCK_90 and WCK_270 with each other. Accordingly, a phase of the system clock CK and a phase of the phase clock signal WCK_0 may be the same at tp1, tp2, tp3, and tp4.

In FIG. 2, an embodiment of the inventive concept is exemplified whereby the WCK divider 224 and the phase switch 226 are independent of each other. However, the scope and spirit of the inventive concept should not be limited thereto. For example, the WCK divider 224 and the phase switch 226 may be integrated in the synchronization circuit 222. In this case, a phase synchronization operation may be understood as including a frequency division operation and a phase swapping operation.

Figure 6:
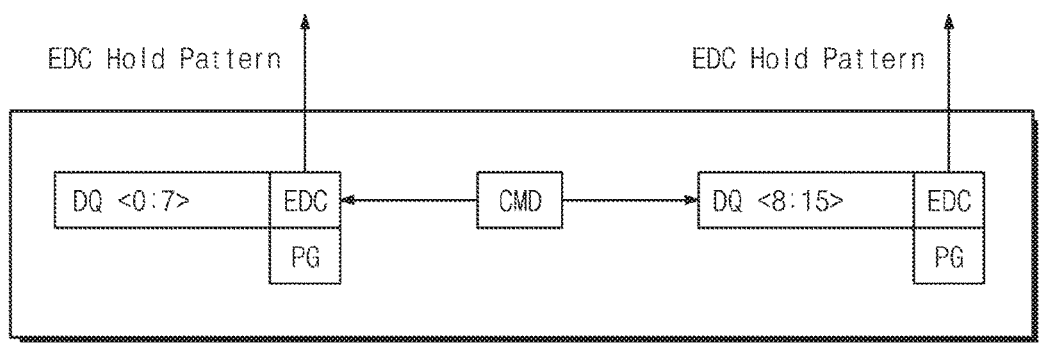
FIG. 6 is a diagram illustrating a case where a pattern generator illustrated in FIG. 1 generates an EDC hold pattern.
Figure 7:
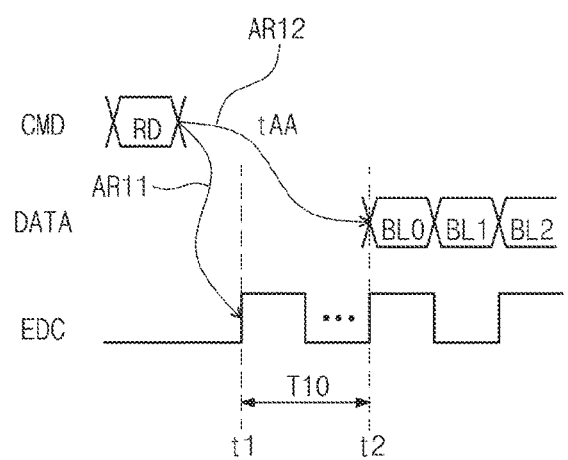
FIG. 7 is a timing diagram for describing generation of an EDC hold pattern according to an embodiment of the inventive concept.

FIG. 6 is a diagram illustrating a case where a pattern generator illustrated in FIG. 1 generates an EDC hold pattern. FIG. 7 is a timing diagram for describing generation of an EDC hold pattern according to an embodiment of the inventive concept.

Referring to FIG. 6, in a CAS command input mode, the pattern generator 250 may output the EDC hold pattern EDC in response to a CAS command The EDC hold pattern may be provided through a shortest latency path. In FIG. 6, an embodiment of the inventive concept is exemplified as an EDC pin is placed every eight DQs. However, the scope and spirit of the inventive concept should not be limited thereto. For example, the number of EDC pins may increase or decrease.

Referring to FIG. 7, when the EDC hold pattern EDC is outputted at t1 in response to a command (refer to an arrow AR11), the memory controller 100 may perform a CDR locking operation during a period in time T10. The CDR circuit 104 of the memory controller 100 may perform a clock data recovery function using the EDC hold pattern EDC.

According to an embodiment of the inventive concept, the period in time T10 may be about 15 ns. Read data may be outputted from the semiconductor memory device 200 at t2.

Figure 8:
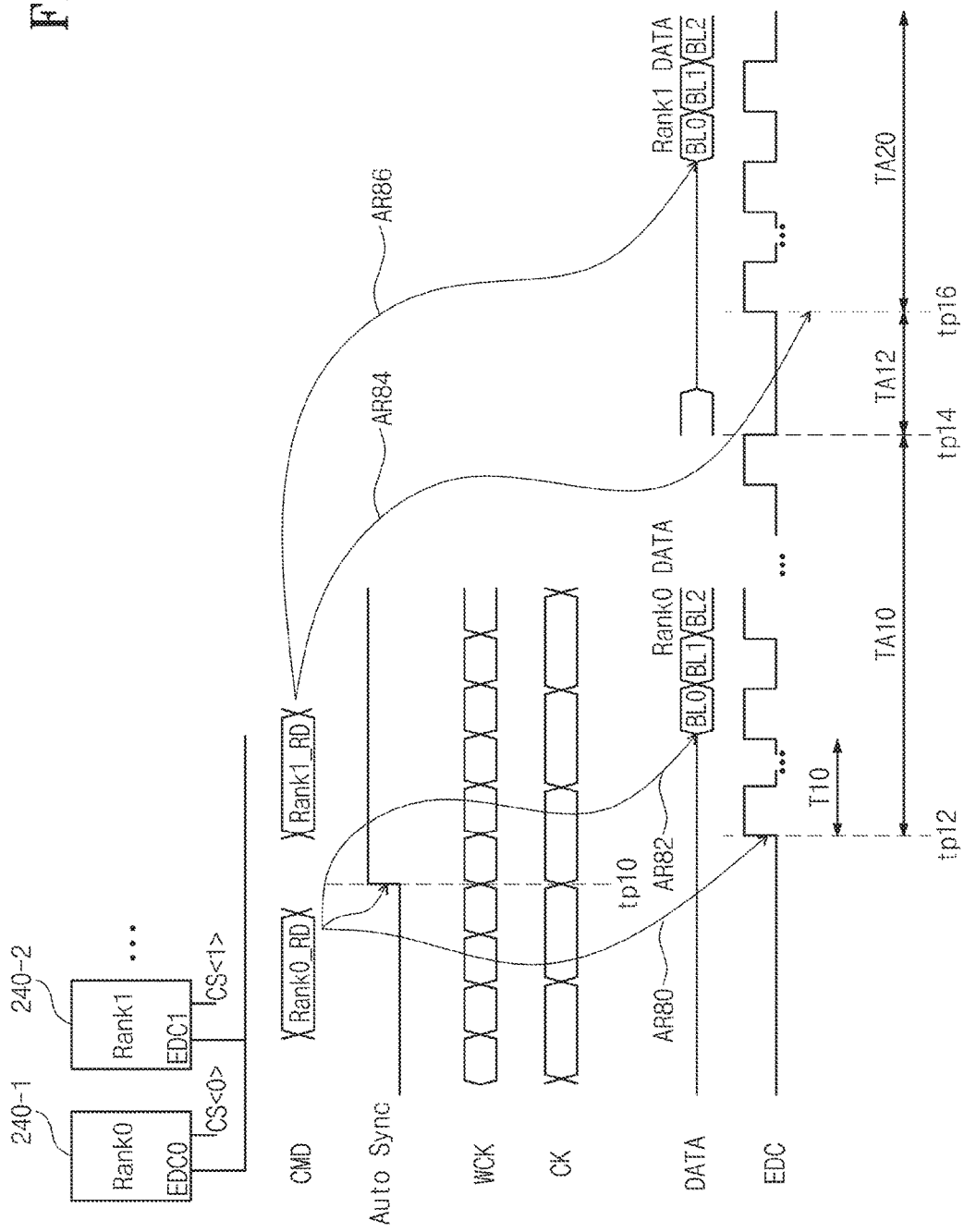
FIG. 8 is a timing diagram illustrating generation of an EDC hold pattern according to another embodiment of the inventive concept.

When the memory cell array 240 has a multi-rank structure, the EDC hold pattern EDC may be generated for a rank. As illustrated in FIG. 8, a non-overlap section for supporting an operation in the multi-rank structure may exist between the EDC hold patterns which are generated for a rank.

FIG. 8 is a timing diagram illustrating generation of an EDC hold pattern according to another embodiment of the inventive concept.

Referring to FIG. 8, when the memory cell array 240 has a multi-rank structure (240-1, 240-2), the EDC hold patterns may be generated in periods in time TA10 and TA20 for a rank respectively. A non-overlap section TA12 may exist between the EDC hold patterns generated for a rank.

The data clock WCK and the system clock CK may be phase synchronized at tp10, and an EDC hold pattern EDC0 about the first memory rank 240-1 may be outputted from the pattern generator 250 at tp12 (refer to an arrow AR80). The memory controller 100 may complete a CDR operation during the period in time T10. After the CDR operation is completed, data read out from the first memory rank 240_1 may be transferred to the memory controller 100 (refer to an arrow AR82). When a read operation about the first memory rank 240-1 is completed, toggling of the EDC hold pattern EDC may be ended at tp14.

After the period in time TA12 elapses, an EDC hold pattern EDC1 about the second memory rank 240_2 may be outputted from the pattern generator 250 at tp16 (refer to an arrow AR84). After the CDR operation is completed, data read out from the second memory rank 240_2 may be transferred to the memory controller 100 (refer to an arrow AR86).

As described above, since the EDC hold pattern is generated in response to a CAS command received at a read or write operation, it may not toggle in an operating section where the CDS command is not received, for example, in a standby mode of operation, and thus, power consumption may be reduced.

Figure 9:
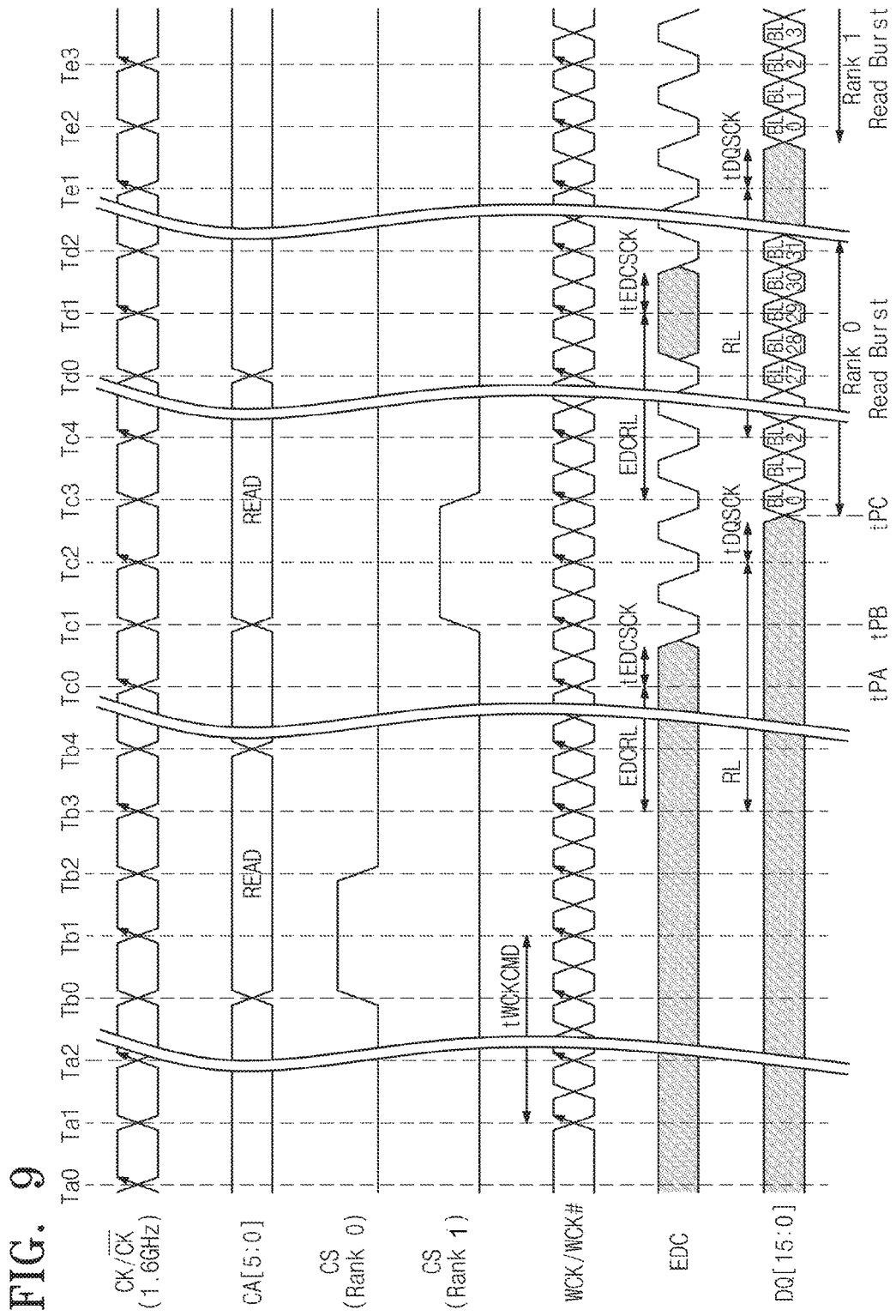
FIG. 9 is a timing diagram illustrating a synchronization operation and a detection clock pattern generating operation according to an embodiment of the inventive concept.

FIG. 9 is a timing diagram illustrating a synchronization operation and a detection clock pattern generating operation according to an embodiment of the inventive concept.

Referring to FIG. 9, system clocks CK and /CK and data clocks WCK and /WCK are applied in the form of differential signals and the EDC hold pattern EDC is generated at tPB.

In FIG. 9, CA[5:0] may be a command/address applied through command/address pins, and CS(Rank 0) may be a chip selection signal used to select the first memory rank 240_1. CS(Rank 1) may be a chip selection signal used to select the second memory rank 240_2. DQ[15:0] may indicate read data output through 16 DQ pins. In exemplary embodiments, a frequency of the system clocks CK and /CK may be about 1.6 GHz.

Phase synchronization between the system clock CK and the data clock WCK may be performed at tPA, and the EDC hold pattern EDC may be outputted at tPB. Read data may be outputted at tPC. RL may indicate a read latency.

When the EDC hold pattern EDC is used as illustrated in FIG. 9, the data clock WCK may toggle before a command (e.g., a CAS command) is received. However, when the EDC hold pattern EDC is not used, the data clock WCK may toggle after a command (e.g., a CAS command) is received.

A read operation may be exemplified in FIG. 9, and a data clock and an EDC hold pattern all may be generated in response to a command Reference symbols not described in FIG. 9, for example, tDQSCK and the like may not be directly associated with embodiments of the inventive concept, and a description thereof may be omitted.

Figure 10:
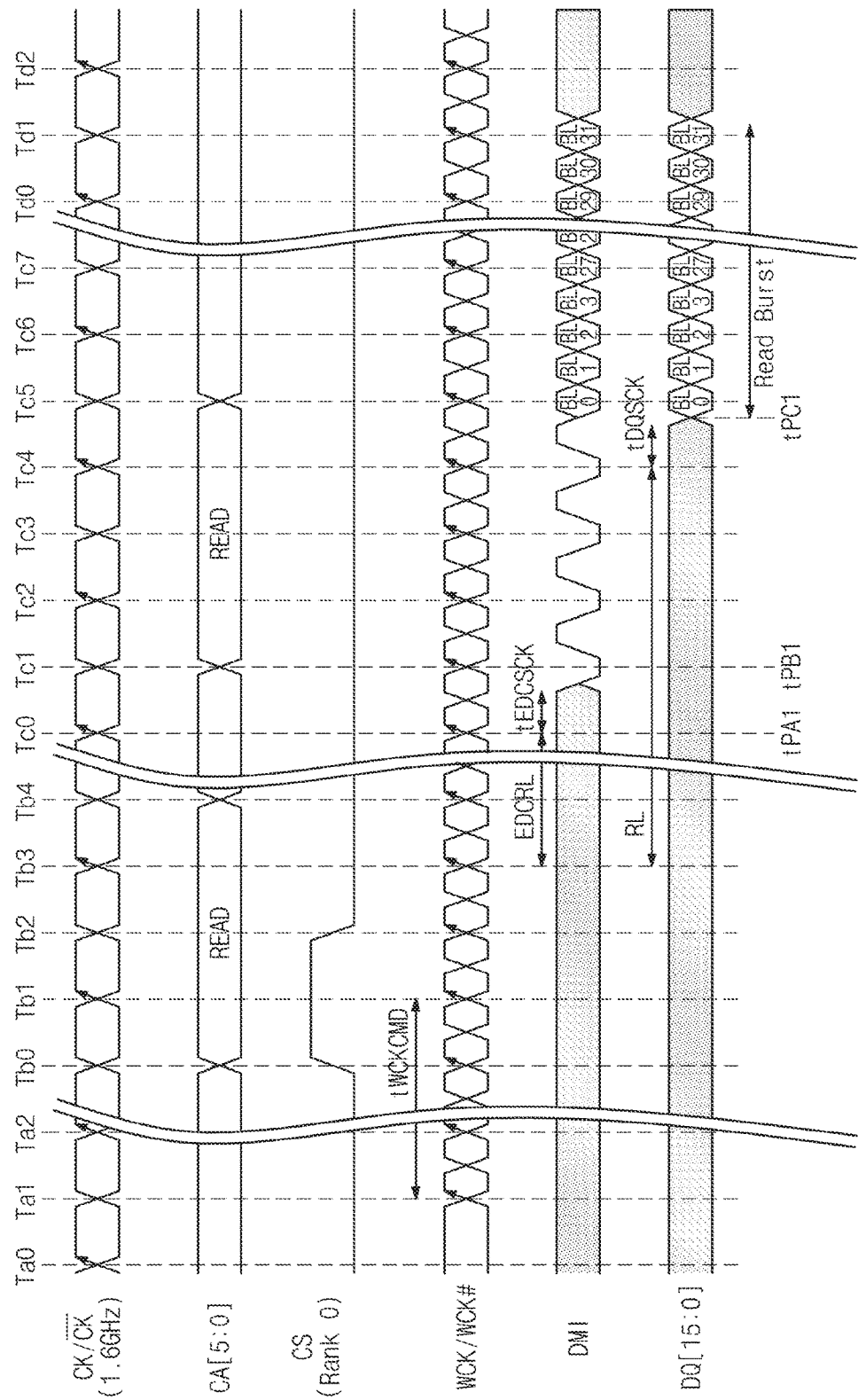
FIG. 10 is a timing diagram illustrating a synchronization operation and a detection clock pattern generating operation according to another embodiment of the inventive concept.

FIG. 10 is a timing diagram illustrating a synchronization operation and a detection clock pattern generating operation according to another embodiment of the inventive concept.

Referring to FIG. 10, system clocks CK and /CK and data clocks WCK and /WCK are applied in the form of differential signals and the EDC hold pattern EDC is outputted. The timing illustrated in FIG. 10 may be substantially same to that illustrated in FIG. 9.

Referring to FIG. 10, the EDC hold pattern EDC may be outputted to the memory controller 100 through a non-dedicated pin, such as a DMI pin, not a dedicated EDC pin. The DMI pin may be used for data masking and may be a non-dedicated pin unlike the EDC pin. When the EDC hold pattern EDC is outputted through the DMI pin, a scheme according to an exemplary embodiment of the inventive concept may be applied to an LPDDR SDRAM which does not include a dedicated EDC pin.

Figure 11:
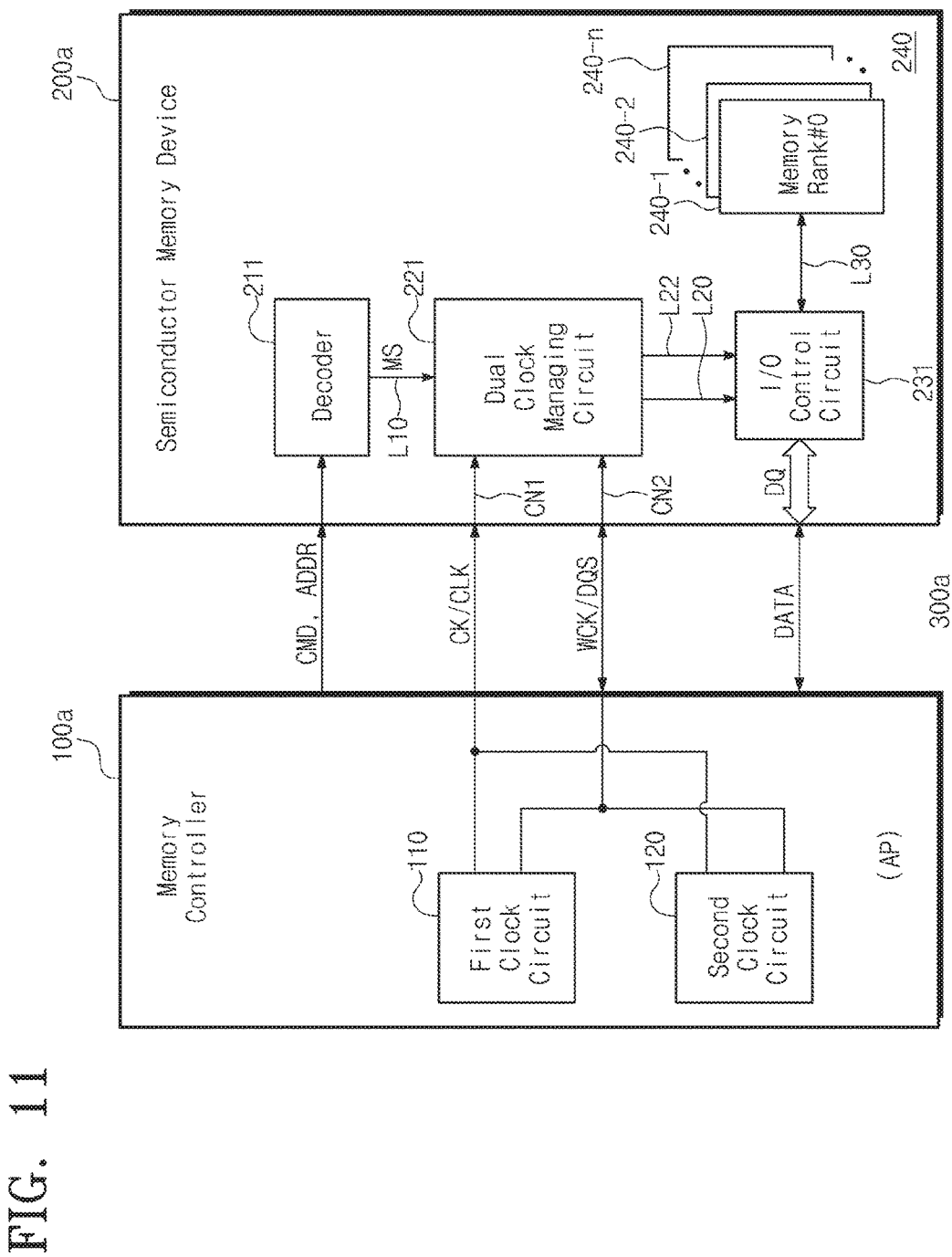
FIG. 11 is a block diagram illustrating a memory system including a semiconductor memory device according to another embodiment of the inventive concept.

FIG. 11 is a block diagram illustrating a memory system including a semiconductor memory device according to another embodiment of the inventive concept.

Referring to FIG. 11, a memory system 300a includes a memory controller 100a and a semiconductor memory device 200a.

The memory controller 100a includes a first clock circuit 110 generating a system clock and a data clock and a second clock circuit 120 generating a system clock and a data output strobe (DQS) signal.

The semiconductor memory device 200a includes a decoder 211 decoding a command/address, a dual clock managing circuit 221, an I/O control circuit 231, and the memory cell array 240.

The decoder 211 may generate a mode selection signal MS in response to a received command, and the mode selection signal MS may be transferred through a line L10.

Figure 13:
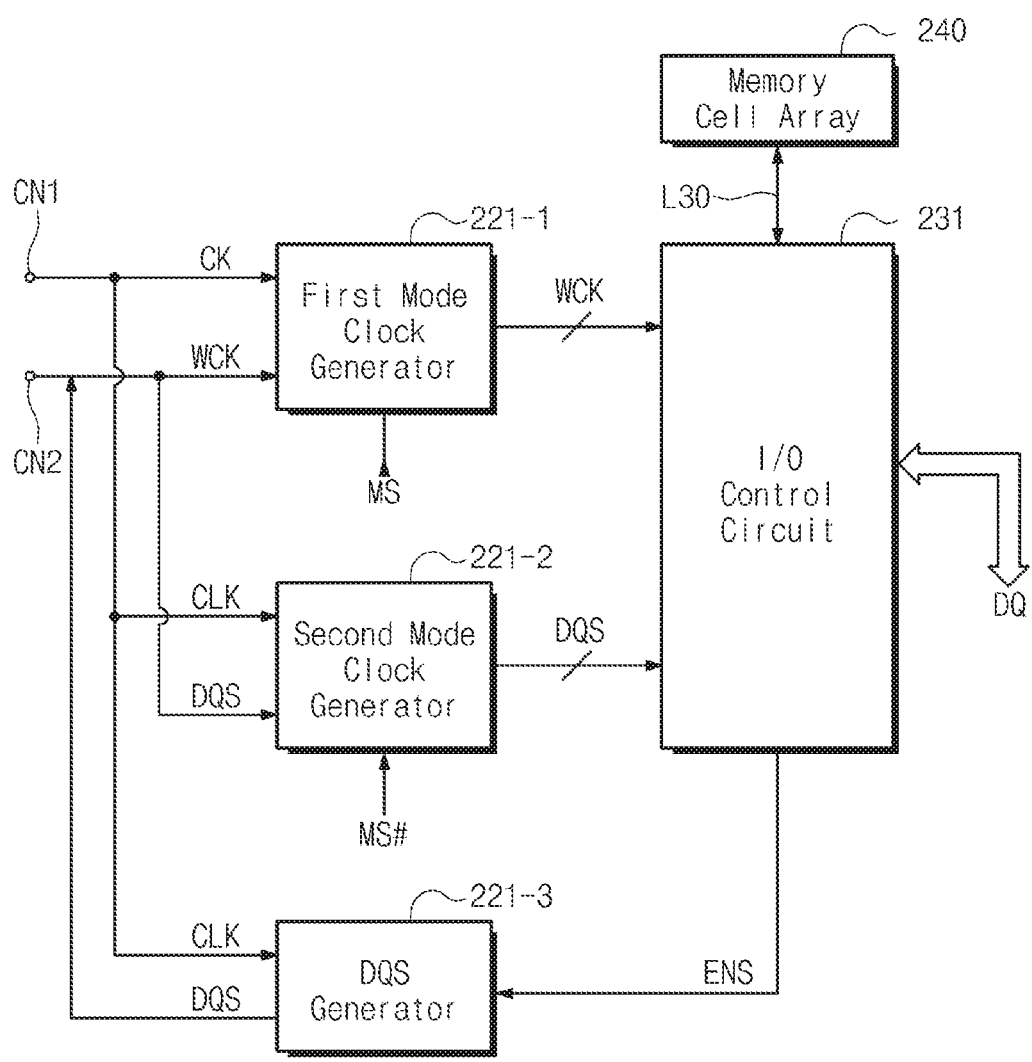
FIG. 13 is a block diagram illustrating a part of a semiconductor memory device illustrated in FIG. 11.

The dual clock managing circuit 221 may be used to reduce power consumption and to relax margin tDQSS between data and a data strobe signal. As illustrated in FIG. 13, the dual clock managing circuit 221 may selectively activate one of a first mode clock generator 221-1 and a second mode clock generator 221-2 in response to the mode selection signal MS.

The dual clock managing circuit 221 includes the first mode clock generator 221-1 which uses a first system clock CK having a first frequency and the data clock WCK having a frequency higher than the first system clock CK and the second mode clock generator 221-2 which uses a second system clock CLK having a second frequency higher than the first frequency and a data output strobe signal DQS of which the frequency is the same as the second system clock CLK.

When the first mode clock generator 221-1 is activated, the semiconductor memory device 200a may have data margin with respect to the timing that the second mode clock generator 221-2 is activated. In this case, the first mode clock generator 221-1 may provide a high-frequency operation compared with the second mode clock generator 221-2. The second mode clock generator 221-2 may provide a low-frequency operation compared with the first mode clock generator 221-1, while reducing operating power consumption. For example, the mode selection signal MS may have a high level at a relatively high frequency to activate the first mode clock generator 221-1. In this case, a complementary mode selection signal MS# may have a low level to inactivate the second mode clock generator 221-2. A level of the mode selection signal MS may be exemplary, not limited to embodiments of the inventive concept. The mode selection signal MS may be generated in various manners such as a mode register set (MRS) signal, user selection, a fuse option, or the like.

As described above, the dual clock managing circuit 221 may activate the first mode clock generator 221-1 at a high frequency to relieve the problem caused by the margin tDQSS between data and a data strobe signal. It may be assumed that a frequency difference between system clocks CK and CLK is double.

In this case, the margin tDQSS may be increased from ±0.5tCK to ±1tCK. Since the margin tDQSS is relaxed, the operating performance of the semiconductor memory device 200a may be improved.

A memory interface between the semiconductor memory device 200a and the memory controller 100a may increasingly become important and tight due to a high-speed and low-power operation. A data read operation may be performed at a high speed under a mounting environment when parameters (e.g., tAC (DQ output access time from CK and /CK), tDQSCK (DQS output access time from CK and /CK), and the like) associated with a system clock and signal integrity characteristics such as slew rate, jitter, data eye, and duty are good. Since a DDR SDRAM includes a delay locked loop (DLL) circuit compensating for skew between a clock and output data, it may be easy to adjust a value of the parameter such as tAC or tDQSCK.

For a data write operation mode, parameters of a data strobe signal itself such as tWPRE (write preamble), tWPST (write postamble), and the like and a parameter tDQSS (write command to first DQS rising edge) indicating a skew between a clock and a data strobe signal may be important. For a data write operation mode performed on a mounting environment, lengths of clock and data strobe signal lines may not be the same on a printed circuit board (PCB) and input capacitance values thereof may be different from each other, thereby causing skew. Accordingly, a mounting (external) value of tDQSS may get out of an allowable range, that is tDQSS_Min (=0.75tCK) and tDQSS_Max (=1.25tCK). Furthermore, even though the allowable range is satisfied, timing margin may be insufficient at a clock domain crossing area where an internal data strobe signal generated in a chip gets together with an internal clock iclk, due to changes in a process, a voltage, and a temperature. In this case, a write operation may be abnormally performed. According to the DDR3 standard, a frequency of a data clock may be four times a frequency of a system clock. For this reason, a data transfer rate may increase eight times compared to the case that data input/output is not performed with the frequency of the system clock. As a data transfer speed increases it may be needed to improve the reliability of data transfer.

According to some embodiments of the inventive concept, as described with reference to FIG. 11, margin tDQSS between data and a data strobe signal may be relaxed through a dual clocking manner, thereby improving the reliability of data transfer. In the case where the margin tDQSS between data and a data strobe signal becomes tighter due to an increase in an operating frequency, it may be possible to ensure the reliability of data transfer through a scheme of the inventive concept.

When the first mode clock generator 221-1 has a first clocking operating manner in which the data clock WCK is received in a write operation mode and a read mode of operation, the second mode clock generator 221-2 may have a second clocking operating manner in which the data output strobe signal DQS is received in a write operation mode and a read mode of operation. For the second clocking operating manner, the data output strobe signal may be generated from the semiconductor memory device 200a during read operation.

In FIG. 11, the memory controller 100a may issue a command CMD and an address ADDR to the semiconductor memory device 200a. Here, a command CMD and an address ADDR may be provided through command/address pins CA.

The memory controller 100a may provide the system clocks CK and CLK, the data clock WCK, and the data output strobe signal DQS to control data input/output.

The system clocks CK and CLK may be a clock which is associated with a transfer rate of an address or a command applied to perform a data input/output operation. The data clock WCK or the data output strobe signal DQS may be a clock which is associated with a data input/output rate.

The I/O control circuit 231 and the memory cell array 240 may be the same as those illustrated in FIG. 1, and a description thereof may be thus omitted.

The memory system 300a illustrated in FIG. 13 may be packaged according to any of a variety of different packaging technologies. Examples of such packaging technologies may include the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

FIG. 12 is a diagram illustrating current consumption of a clock buffer according to a frequency of a system clock used in a semiconductor memory device illustrated in FIG. 11.

Referring to FIG. 12, for an LPDDR3 SDRAM having a clock frequency of 800 MHz, a clock buffer may consume a current of about 1 mA. For an LPDDR4 SDRAM having a clock frequency of 1600 MHz, the clock buffer may consume a current of about 3 mA. For an LPDDR5 SDRAM having a clock frequency of 3200 MHz, the clock buffer may consume a current of about 6 mA. When a clock frequency increases two times, current consumption may increase three times. When a clock frequency increases four times, current consumption may increase six times. Here, the clock frequency may mean a frequency of the system clock CK, and the clock buffer may be a system clock buffer which receives and buffers a system clock in a semiconductor memory device.

Current consumption of a data clock buffer which buffers the data clock CLK may be greater than that of the system clock buffer.

However, when a command-based clock generation scheme according to some embodiments of the inventive concept is applied to a semiconductor memory device, a data clock need not free run in the semiconductor memory device, thereby reducing or minimizing current consumption.

FIG. 13 is a block diagram illustrating a part of a semiconductor memory device illustrated in FIG. 11.

Referring to FIG. 13, the dual clock managing circuit 221 may receive a mode selection signal from a decoder illustrated in FIG. 11 and may include the first mode clock generator 221-1, the second mode clock generator 221-2, and a DQS generator 221-3.

The first mode clock generator 221-1 may use a first system clock, which has a first clock frequency, and a data clock, which has a clock frequency higher than the first system clock. This may be referred to as a first clocking operating manner The first clocking operating manner may mean a WCK clocking operating manner The second mode clock generator 221-2 may use a second system clock, which has a second clock frequency higher than the first clock frequency, and a data output strobe signal, of which the frequency is the same as the second system clock. This may be referred to as a second clocking operating manner. The second clocking operating manner may mean a DQS clocking operating manner. For the DQS clocking operating manner, the DQS generator 221-3 may be activated by an enable signal received during read operation of a semiconductor memory device and may generate a data output strobe (DQS) signal.

When the first clocking operating manner is determined, the I/O control circuit 231 may input and output data based on the WCK clock and may process (e.g., decode) a command and an address based on the system clock CK.

When the second clocking operating manner is determined, the I/O control circuit 231 may input and output data based on the DQS clock and may process (e.g., decode) a command and an address based on the system clock CLK.

According to the above description, the first clocking operating manner may be activated at a high-frequency operation, thereby improving margin tDQSS. In contrast, the second clocking operating manner may be activated at a low-frequency operation, thereby making it possible to ensure the performance of operation.

Figure 14:
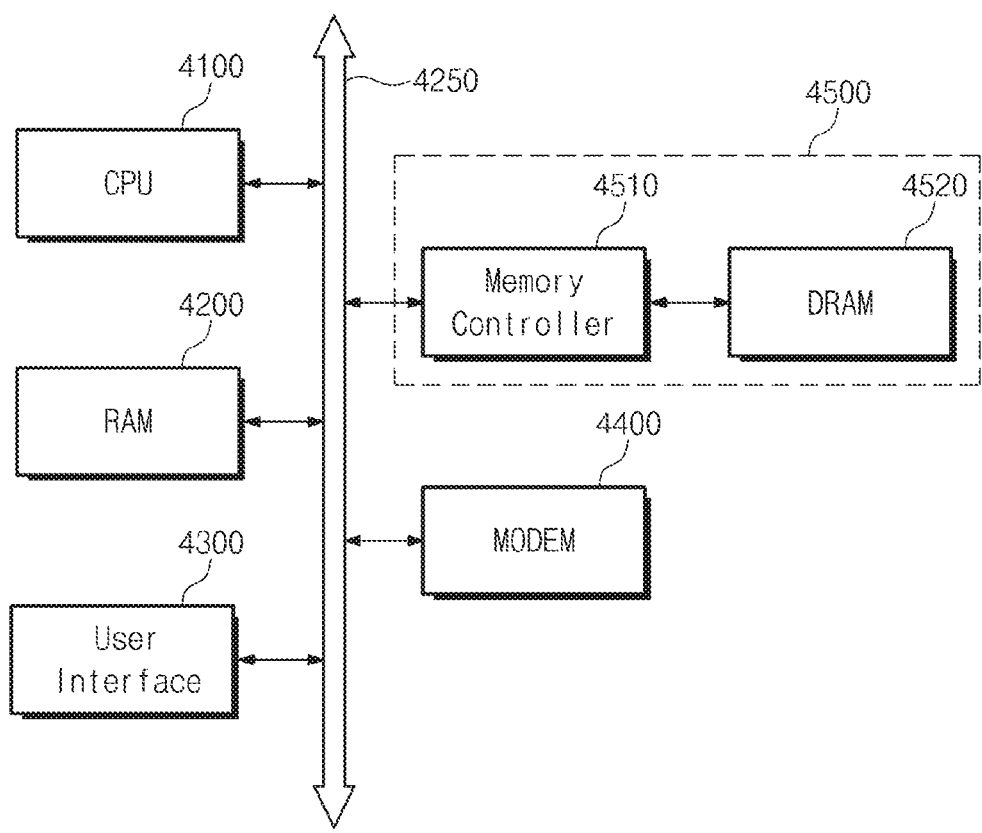
FIG. 14 is a block diagram illustrating a computing device according to an embodiment of the inventive concept.

FIG. 14 is a block diagram illustrating a computing device according to an embodiment of the inventive concept.

Referring to FIG. 14, a computing device includes a memory system 4500 which includes a memory controller 4510 and a DRAM 4520. The computing device may include an information processing device or a computer. For example, the computing device further includes a central processing unit (CPU) 4100, a RAM 4200, a user interface 4300, and a modem 4400, which are electrically connected to a system bus 4250, as well as the memory system 4500. Data processed by the CPU 4100 or data inputted from an external device may be stored in the memory system 4500.

The computing device may be applied to a solid state disk, a camera image sensor, an application chipset, and like. For example, the memory system 4500 may be implemented with a solid state drive (SSD). In this case, the computing device may store mass data at the memory system 4500.

In the memory system 4500, the memory controller 4510 may send a command, an address, data, and any other control signals to the DRAM 4520.

The CPU 4100 may function as a host and may control an overall operation of the computing device.

A host interface between the CPU 4100 and the memory controller 4510 may include a variety of protocols for changing exchange between the memory controller 4510 and a host. In some embodiments, the memory controller 4510 may be configured to communicate with the host or an external device through at least one of various protocols including the following: universal serial bus(USB) protocol, multimedia card (MMC) protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, and integrated drive electronics (IDE) protocol.

The computing device shown in FIG. 14 may be provided as one of various components of an electronic devices, such as a computer, a ultra-mobile personal computer (UMPC), a digital picture player, a digital video recorder, a digital video player, storage forming a data center, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system.

The DRAM 4520 may have a clocking scheme described with reference to FIG. 1 or 11, thereby lowering a cost for implementation of the computing device and improving the performance of operation.

Figure 15:
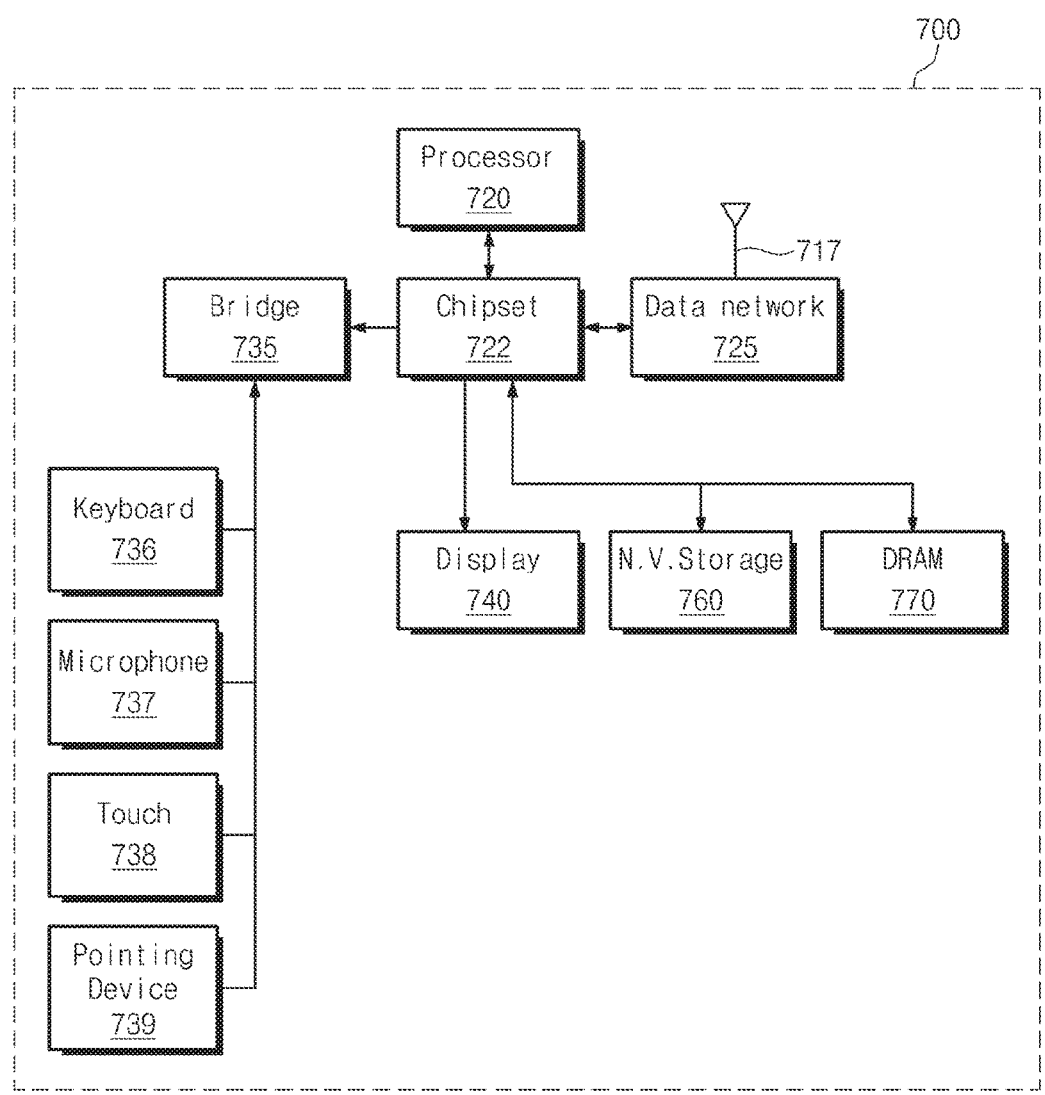
FIG. 15 is a block diagram illustrating a portable multimedia device according to an embodiment of the inventive concept.

FIG. 15 is a block diagram illustrating a portable multimedia device according to an embodiment of the inventive concept.

Referring to FIG. 15, a portable multimedia device 700 includes a processor 720, a chipset 722, a data network 725 connected to antenna 717, a bridge 735, a display 740, nonvolatile storage 760, a DRAM 770, a keyboard 736, a microphone 737, a touch unit 738, and a pointing device 739. The DRAM may be configured as illustrated in FIG. 1 or 11, thereby lowering a cost for implementation of the computing device and improving the performance of operation.

The chipset 722 may provide the DRAM 770 with a command, an address, data, or any other control signals.

The processor 720 may function as a host and may control an overall operation of the portable multimedia device 700.

A host interface between the processor 720 and the chipset 722 may include a variety of protocols for data communications.

The nonvolatile storage 760 may be implemented with an electrically erasable programmable read-only memory (EEPROM), a flash memory, a magnetic RAM (MRAM), a spin-transfer torque MRAM (STT-MRAM), a conductive bridging RAM (CBRAM), a ferroelectric RAM (FeRAM), a phase change RAM (PRAM) called OUM (Ovonic Unified Memory), a resistive RAM (RRAM or ReRAM), a nanotube RRAM, a polymer RAM (PoRAM), a nano floating gate memory (NFGM), a holographic memory, a molecular electronics memory device, or an insulator resistance change memory.

The portable multimedia device 700 illustrated in FIG. 15 may be changed or expanded as one of various components of an electronic device, such as a computer, a ultra-mobile personal computer (UMPC), a workstation, a net-book, a personal digital assistance (PDA), a portable computer (PC), a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, storage as a data center, a device for transmitting and receiving information in a wireless environment, one of various electronic devices constituting a home network, one of various electronic devices constituting a computer network, one of various electronic devices constituting a telematics network, a radio frequency identification (RFID) device, or one of various components constituting a computing system.

Figure 16:
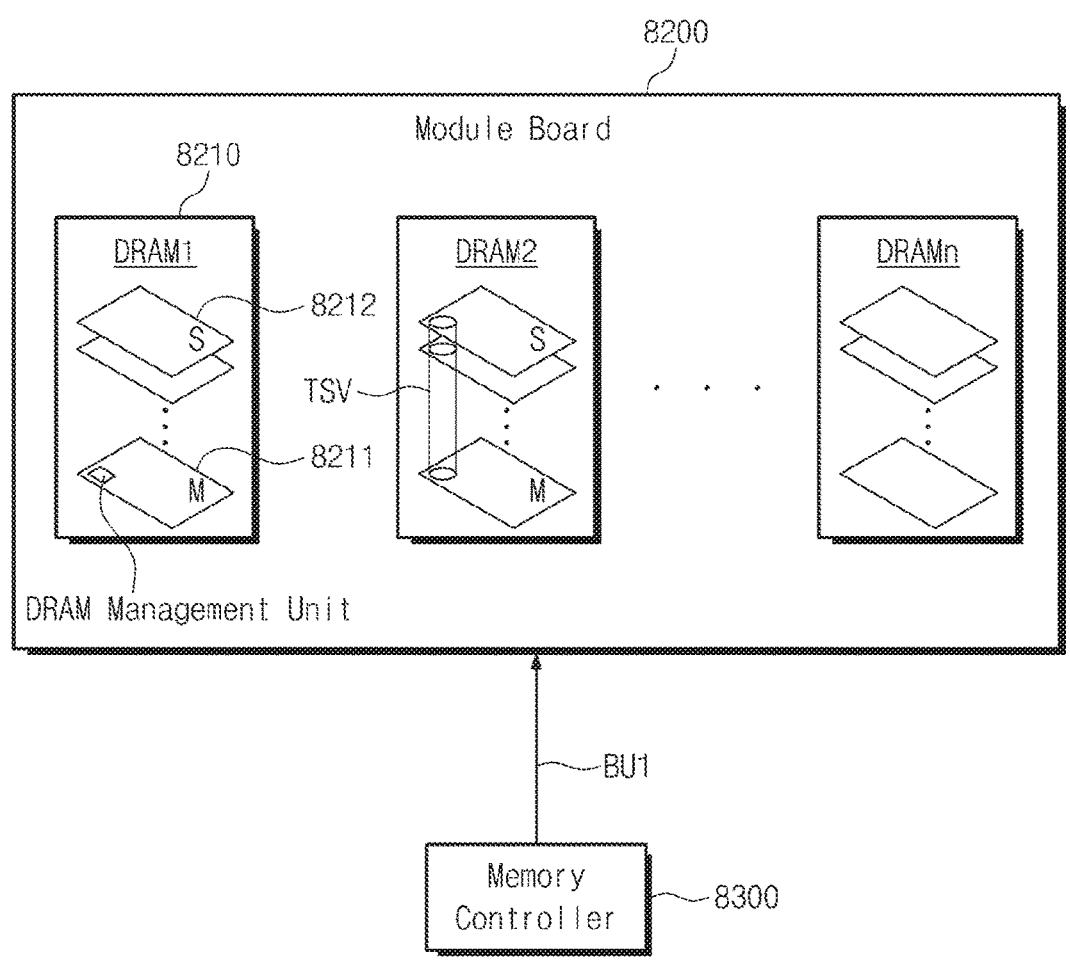
FIG. 16 is a block diagram illustrating a stack-type memory module according to an embodiment of the inventive concept.

FIG. 16 is a block diagram illustrating a stack-type memory module according to an embodiment of the inventive concept. For descriptive convenience, a memory controller 8300 may be illustrated together with a memory module.

As illustrated in FIG. 16, a memory module 8200 includes one or more semiconductor memory devices 8210 mounted on a module board. The semiconductor memory device 8210 may be a DRAM chip. Each of the semiconductor memory devices 8210 may include a plurality of semiconductor layers. The semiconductor layers may include one or more master chips 8211 which may include a DRAM management unit, and one or more slave chips 8212.

Signal transmission between the semiconductor layers may be performed using through silicon vias (TSVs). The memory module 8200 may communicate with the memory controller 8300 through a system bus Bill such that a command CMD/CMD_CPL, an address ADD, a flag, and information bits may be transmitted and received between the memory module 8200 and the memory controller 8300.

The semiconductor memory device 8210 may be configured as illustrated in FIG. 1 or 11, thereby reducing power consumption and improving margin tDQSS between a clock and a data strobe signal at a high-speed operation. Accordingly, power consumption of the memory module may be minimized or reduced, and the operating performance of the memory module may be improved.

Figure 17:
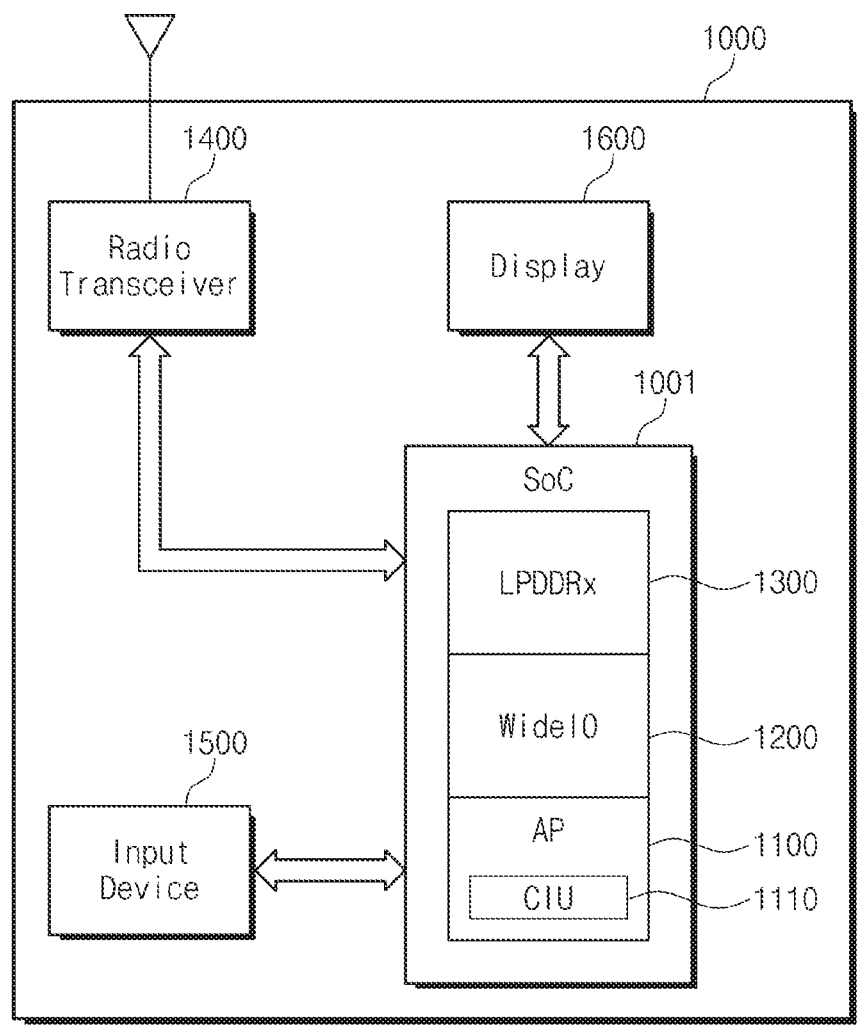
FIG. 17 is a block diagram illustrating a mobile electronic device according to an embodiment of the inventive concept.
Figure 18:
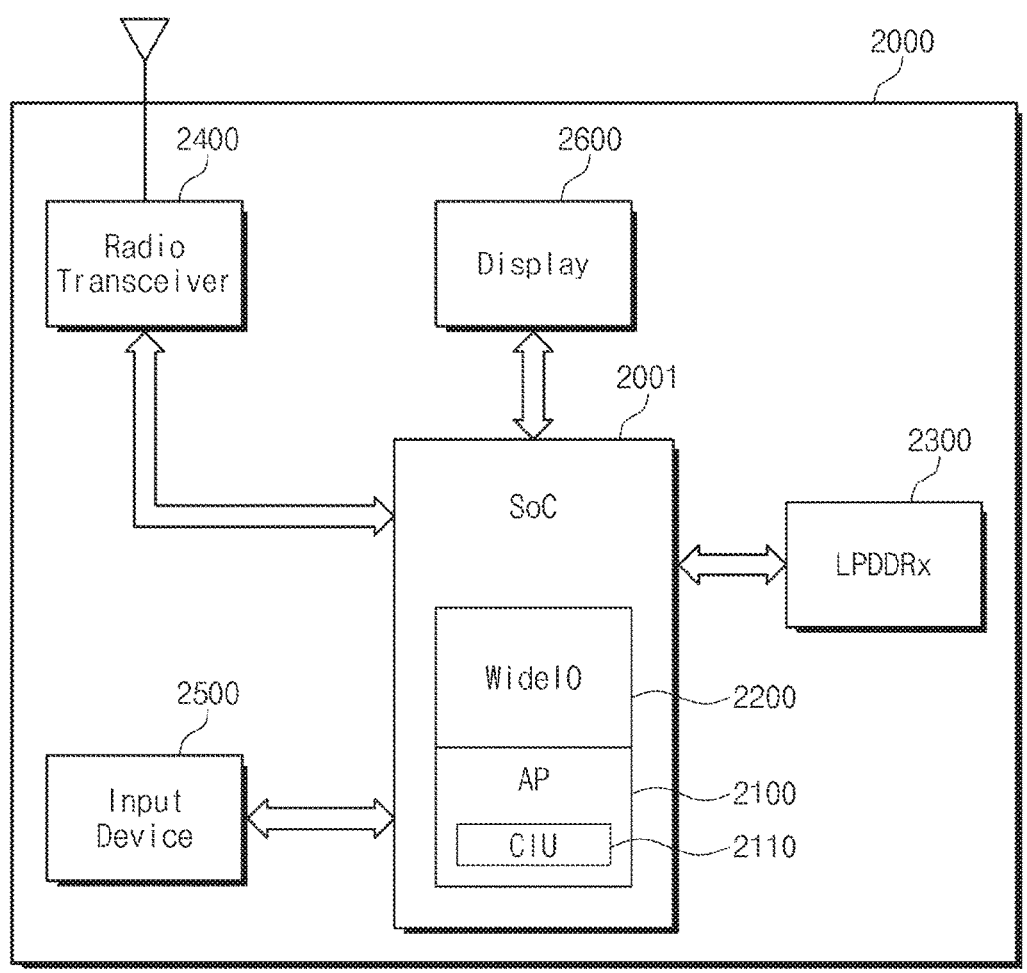
FIG. 18 is a block diagram illustrating a modification of the embodiment described with respect to FIG. 17.

FIG. 17 is a block diagram illustrating a mobile electronic device according to an embodiment of the inventive concept. FIG. 18 is a block diagram illustrating a modification of the embodiment described with respect to FIG. 17.

Each of mobile electronic devices 1000 and 2000 illustrated in FIGS. 17 and 18 may be a device with a wireless internet function such as a cellular phone, a smartphone, or a tablet PC.

Referring to FIG. 17, the mobile electronic device 1000 includes a system on chip (SoC) 1001. The SoC 1001 may be manufactured in the form of a package on package (PoP). The SoC 1001 includes an application processor 1100, a WideIO memory 1200, and an LPDDRx memory 1300 (x being an integer of 3 or more). Here, the LPDDRx DRAM 1300 may mean a low-power DDR DRAM.

In the case where a channel interleaving unit (CIU) 1110 is implemented in the application processor 1100, it may perform a channel interleaving operation between the WideIO memory 1200 and the LPDDRx memory 1300.

A radio transceiver 1400 may receive and transmit wireless signals through an antenna. For example, the radio transceiver 1400 may convert wireless signals received through the antenna into signals that the SoC 1001 is capable of processing. The SoC 1001 may perform data processing about signals from the radio transceiver 1400, and it may store the processed data at the WideIO memory 1200 or the LPDDRx memory 1300 or may display the processed data through a display 1600.

Furthermore, the radio transceiver 1400 may convert signals from the SoC 1001 into wireless signals and may output the converted wireless signals to the outside through the antenna.

An input device 1500 may be a device which receives control signals for controlling an operation of the SoC 1001 or data to be processed by the SoC 1001 and may be a pointing device, such as a touch pad or a computer mouse, a keypad, or a keyboard.

The SoC 1001 may control an operation of the display 1600 such that data from the WideIO memory 1200 or the LPDDRs memory 1300, wireless signals from the wireless transceiver 1400, or data from the input device 1500 is displayed through the display 1600.

Referring to FIG. 18, the mobile electronic device 2000 includes a system on chip (SoC) 2001, a memory 2300, a radio transceiver 2400, an input device 2500, and a display 2600. The SoC 2001 includes an application processor 2100 including a channel interleaving unit 2110 and a WideIO memory 2200. The channel interleaving unit 2110 which is implemented in the application processor 2100 may perform a channel interleaving operation between the WideIO memory 2200 and the LPDDRx memory 2300.

In FIGS. 17 and 18, an embodiment of the inventive concept is exemplified whereby the SoC 2001 includes the WideIO memory 2200 and the channel interleaving unit 2110. However, an LPDDRx memory may be independently provided outside or inside the SoC 2001 without the channel interleaving unit 2110 and the WideIO memory 2200.

Each of the mobile electronic devices illustrated in FIGS. 17 and 18 may include an LPDDRx memory configured as illustrated in FIG. 1 or 11, thereby reducing power consumption and improving the performance of operation.

Figure 19:
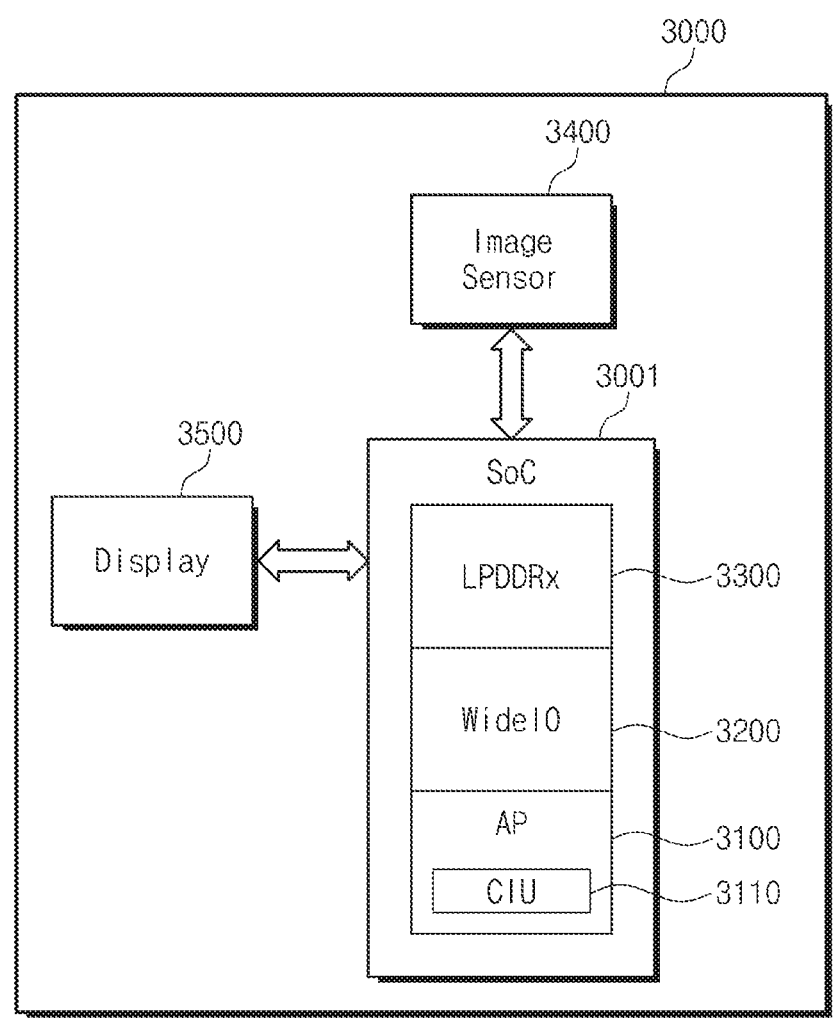
FIG. 19 is a block diagram illustrating a SoC-based electronic device according to an embodiment of the inventive concept.
Figure 20:
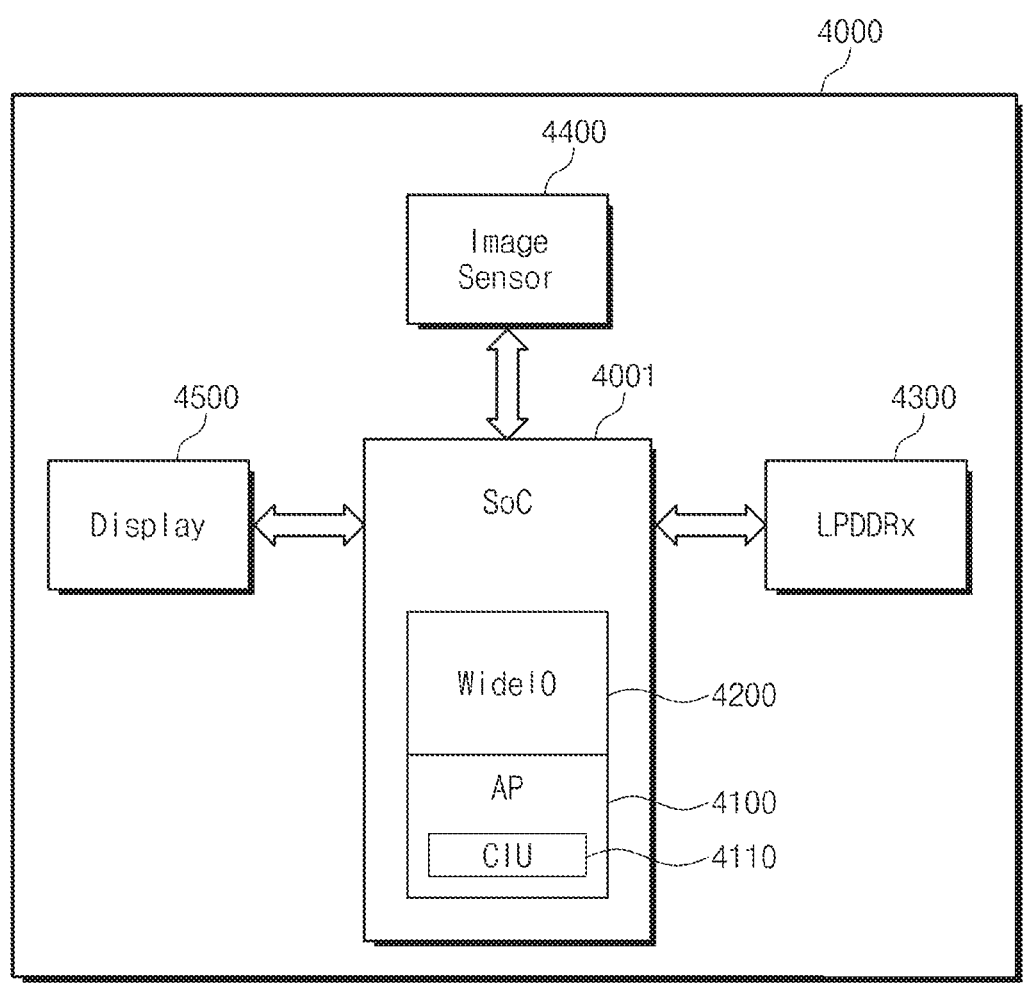
FIG. 20 is a block diagram illustrating a modified modification of the embodiment described with respect to FIG. 19.

FIG. 19 is a block diagram illustrating a SoC-based electronic device according to an embodiment of the inventive concept. FIG. 20 is a block diagram illustrating a modification of the embodiment described with respect to FIG. 19.

Referring to FIGS. 19 and 20, an electronic device 3000/400 includes a system on chip 3001/4001. The system on chip 3001/4001 may selectively include a channel interleaving unit 3110/4110. When the channel interleaving unit 3110/4110 is selectively included in the system on chip 3001/4001, it may perform a channel interleaving operation between a WideIO memory 3200/4200 and an LPDDRx memory 3300/4300.

In the electronic devices 3000 and 4000 illustrated in FIGS. 19 and 20, each of image sensors 3400 and 4400 may convert an optical image into a digital signal. Each of the system on chips 3001 and 4001 may process the converted digital signals based on a virtual address and may generate data. Each of the system on chips 3001 and 4001 may convert the virtual address into a physical address and may store the data at the physical address of the WideIO memory 3200/4200 or the LPDDRx memory 3300/4300.

Data stored at the WideIO memory 3200/4200 or the LPDDRx memory 3300/4300 may be displayed through a display 3500/4500 under a control of the system on chip 3001/4001.

In FIGS. 19 and 20, an embodiment of the inventive concept is exemplified whereby an electronic device includes a WideIO and a channel interleaving unit. However, the scope and spirit of the inventive concept should not be limited thereto. For example, an LPDDRx memory may be independently provided outside or inside the system on chip 3001/4001 without a channel interleaving unit and a WideIO memory.

Each of the electronic devices illustrated in FIGS. 19 and 20 may include an LPDDRx memory configured as illustrated in FIG. 1 or 11, thereby reducing power consumption and improving the performance of operation.

According to an exemplary embodiment of the inventive concept, a data clock or an EDC hold pattern may be generated based on a CAS command applied at a read operation or a write operation, thereby reducing or minimizing power consumption. Furthermore, since a dual clocking operating manner is selectively implemented, margin tDQSS between data and a data output strobe signal may be ensured sufficiently at a high frequency.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

In some cases, a detailed implementation manner of clocking operating may be variously changed or modified by changing circuit components of drawings or adding or subtracting components without departing from the spirit and scope of the inventive concept. Also, an embodiment of the inventive concept is exemplified as a semiconductor memory device includes a DRAM. However, the scope and spirit of the inventive concept may not be limited thereto.

What is claimed is:

1. A semiconductor memory device comprising:
a command decoder configured to generate an auto-sync signal in response to a command for writing data to a memory cell or reading data from a memory cell;
an internal data clock generating circuit configured to adjust a phase of a second clock to be synchronized with a phase of a first clock in response to the auto-sync signal, wherein a frequency of the second clock is higher than a frequency of the first clock,
wherein the first clock is a system clock associated with a transfer rate of the command or an address, and the second clock is a data clock associated with an input/output rate of the data; and
a pattern generator configured to generate a detection clock pattern in response to the command.

2. The semiconductor memory device of claim 1, wherein the command is a column address strobe (CAS) command.

3. The semiconductor memory device of claim 1, wherein the second clock starts to toggle before the command is received.

4. The semiconductor memory device of claim 1, wherein a phase synchronization operation of the internal data clock generating circuit is performed as a hidden operation of a normal memory operation within a column address strobe latency.

5. The semiconductor memory device of claim 1, wherein phase synchronization of the second clock is performed by swapping four-phase clock signals obtained by dividing a frequency of the second clock by a preset ratio.

6. The semiconductor memory device of claim 1, wherein the detection clock pattern is an error detect code (EDC) hold pattern for providing a clock data recovery function.

7. The semiconductor memory device of claim 6, wherein the EDC hold pattern is generated for each rank in a case of a multi-rank structure, and
wherein a non-overlap section exists between the EDC hold patterns generated for the ranks.

8. A semiconductor memory device comprising:
a command decoder configured to generate an auto-sync signal in response to a command for writing data to a memory cell or reading data from a memory cell; and
an internal data clock generating circuit configured to adjust a phase of a second clock to be synchronized with a phase of a first clock in response to the auto-sync signal, wherein a frequency of the second clock is higher than a frequency of the first clock,
wherein the auto-sync signal is a pulse signal which is delayed by a predetermined time from an end point of an input command, and
wherein the second clock starts to toggle before the command is received.

9. The semiconductor memory device of claim 8, wherein the first clock is a system clock associated with a transfer rate of the command or an address, and the second clock is a data clock associated with an input/output rate of the data.

10. The semiconductor memory device of claim 8, wherein the command is a column address strobe (CAS) command.

11. The semiconductor memory device of claim 8, wherein a phase synchronization operation of the internal data clock generating circuit is performed as a hidden operation of a normal memory operation within a column address strobe latency.

12. The semiconductor memory device of claim 8, wherein phase synchronization of the second clock is performed by swapping four-phase clock signals obtained by dividing a frequency of the second clock by a preset ratio.

13. The semiconductor memory device of claim 8, further comprising:
a pattern generator configured to generate a detection clock pattern in response to the command.

14. The semiconductor memory device of claim 13, wherein the detection clock pattern is an error detect code (EDC) hold pattern for providing a clock data recovery function.

15. A semiconductor memory device comprising:
a decoder configured to generate a mode selection signal in response to a command; and
a dual clock managing circuit configured to selectively activate one of a first mode clock generator and a second mode clock generator in response to the mode selection signal,
wherein the first mode clock generator uses a first system clock having a first clock frequency and a data clock having a clock frequency higher than the first system clock,
wherein the second mode clock generator uses a second system clock having a second clock frequency higher than the first clock frequency and a data output strobe signal of which a frequency is the same as the second clock frequency, and
wherein an activating frequency of the first mode clock generator is higher than an activating frequency of the second mode clock generator.

16. The semiconductor memory device of claim 15, wherein when the first mode clock generator has a first clocking operating manner where the data clock is received in a write operation mode and a read operation mode, the second mode clock generator has a second clocking operating manner where the data output strobe signal is received in the write operation mode and is generated in the read operation mode.

17. The semiconductor memory device of claim 15, wherein the semiconductor memory device is a low-power double data rate dynamic random access memory for use in a mobile device.

* * * * *